United States Patent [19]

Ueta et al.

[11] Patent Number: 5,776,764

[45] Date of Patent: Jul. 7, 1998

[54] POLYSILANE TYPE PHOTOSENSITIVE RESIN COMPOSITION AND METHOD FOR FORMING PATTERN USING THE SAME

[75] Inventors: Emi Ueta, Osaka; Hiroshi Tsushima, Takatsuki; Iwao Sumiyoshi, Osaka, all of Japan

[73] Assignee: Nippon Paint Co., Ltd., Japan

[21] Appl. No.: 723,387

[22] Filed: Sep. 30, 1996

Related U.S. Application Data

[63] Continuation-in-part of Ser. No. 326,314, Oct. 20, 1994, abandoned.

[30] Foreign Application Priority Data

Oct. 20, 1993 [JP] Japan ................... 5-262287

[51] Int. Cl.$^6$ ................... G03C 1/73; C08J 3/28
[52] U.S. Cl. ................... 430/270.1; 430/326; 430/920; 522/24; 522/26; 522/148
[58] Field of Search ................... 430/270.1, 326, 430/920; 522/24, 26, 148; 525/474

[56] References Cited

U.S. PATENT DOCUMENTS

| | | | |
|---|---|---|---|
| 4,766,055 | 8/1988 | Kawabata et al. | 430/920 X |
| 4,820,788 | 4/1989 | Zeigler | 528/33 |
| 4,822,716 | 4/1989 | Onishi et al. | 430/270 X |
| 4,871,646 | 10/1989 | Hayase et al. | 430/270 X |
| 4,886,735 | 12/1989 | Boettcher et al. | 430/270 X |
| 5,254,602 | 10/1993 | Tomura et al. | 522/24 |

FOREIGN PATENT DOCUMENTS

| | | | |
|---|---|---|---|
| 0 502 662 | 9/1992 | European Pat. Off. | |
| 42 22 423 | 1/1993 | Germany | |
| 62-222247 | 9/1987 | Japan | 430/270 |
| 62-226147 | 10/1987 | Japan | 430/270 |
| 63-141046 | 6/1988 | Japan | 430/270 |
| 4155344 | 5/1992 | Japan | 430/270 |
| 2 156 834 | 10/1985 | United Kingdom | |

OTHER PUBLICATIONS

C.G. Roffey, "Photopolymerization of Surface Coatings", pp. 277–278 (1992).
English Translation of JP–04–15534.
English Translation of JP–62–226147.
English Translation of JP–62–222247.
English Translation of JP–63–141046.
March et al. "General Chemistry" p. 490–491, 1979.
Rosilio et al., Microelectronic Engineering, "Contribution of the Study of Polysilanes for High–resolution Photolithography", Aug. 8, 1988, pp. 55–78.
Wallraff et al., Polym. Mat. Sci. Eng., "Sensitive Polysilane Resists for Bilayer Lithography", vol. 66, 1992, pp. 104–109.

*Primary Examiner*—George F. Lesmes
*Assistant Examiner*—Bernard P. Codd
*Attorney, Agent, or Firm*—Wenderoth, Lind & Ponack

[57] ABSTRACT

The present invention provides a photosensitive resin composition wherein a sensitiveness of polysilane to photodegradation is improved and a time required for photodegradation is short. The photosensitive resin composition comprises:

(a) a polysilane having a structure of the formula:

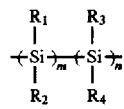

[wherein $R_1$, $R_2$, $R_3$ and $R_4$, the same or different, are selected from the group consisting of a substituted or non-substituted aliphatic hydrocarbon group, an alicyclic hydrocarbon group and an aromatic hydrocarbon group, and m and n indicate an integer], (b) a photoradical generator, and (c) an oxidizing agent. A method for forming a pattern using the photosensitive resin composition is also disclosed.

3 Claims, 1 Drawing Sheet

POLYSILANE TYPE PHOTOSENSITIVE RESIN COMPOSITION AND METHOD FOR FORMING PATTERN USING THE SAME

This application is a Rule 62 continuation-in-part of now abandoned application, Ser. No. 08/326,314, filed Oct. 20, 1994.

FIELD OF THE INVENTION

The present invention relates to a polysilane type photosensitive resin composition and a method for forming a pattern using the same.

BACKGROUND OF THE INVENTION

Recently, a study about a two-layer resist using polysilane has been made intensively for the purpose of the development of a resist for forming an ultrafine pattern in high accuracy. Further, Tsushima et al. has found that a colored pattern obtained by exposing a polysilane thin film to ultraviolet light and dipping the exposed thin film in a sol of a metal oxide containing a dye or a pigment can be applied for a color filter (U.S. Pat. No. 5,391,442 or EP Patent Appln. No. 93,300,228.9).

However, long-time exposure is required for photodecomposition of polysilane because of low reaction rate and low sensitiveness. Accordingly, there is a problem that productivity is deteriorated.

It has hitherto been found to be effective to add sensitizers (e.g. triazine, etc.) or peroxides to polysilane in order to improve the sensitiveness of polysilane to photodegradation (Japanese Laid-Open Patent Publication No. 61-189533; G. M. Wallraff et al., Polym. Mat. Sci. Eng., No. 66, page 105 (1992)). However, in these prior arts, exposure time is still long and it is necessary to add a large amount of the sensitizer in order to reduce the exposure time. The large amount of additives deteriorates physical properties of polysilane itself and, therefore, it is requested to improve the sensitiveness of polysilane to photodegradation by formulating additives in the smallest possible amount.

SUMMARY OF THE INVENTION

The above conventional problems are solved by the present invention. That is, one object of the present invention is to provide a polysilane resin composition wherein the exposure can be completed in a short period of time.

Another object of the present invention is to provide a method for forming a pattern using the polysilane resin composition.

The present invention provides a photosensitive resin composition comprising:

(a) a polysilane having a structure of the formula:

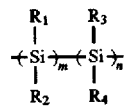

[wherein $R_1$, $R_2$, $R_3$ and $R_4$, the same or different, are selected from the group consisting of a substituted or non-substituted aliphatic hydrocarbon group, an alicyclic hydrocarbon group and an aromatic hydrocarbon group, and wherein at least one of; m and n are positive integers].

(b) a photoradical generator, and (c) an oxidizing agent.

The present invention also provides a method for forming a thin film pattern of a metal oxide, which comprises the steps of:

- forming a photosensitive layer composed of the photosensitive resin composition of claim 1 on a substrate;
- selectively exposing the photosensitive layer to light according to a pattern to form a patterned latent image; and
- dipping the photosensitive layer having the latent image in a sol of the metal oxide.

These objects as well as other objects and advantages of the present invention will become apparent to those skilled in the art from the following description with reference to the accompanying drawings.

DETAILED DESCRIPTION OF THE INVENTION

Figure 1A:
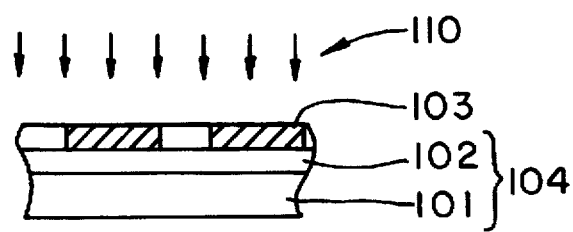
FIGS. 1 (a) to (d) are schematic diagrams illustrating one embodiment of the steps of forming a thin film pattern according to the method for forming a pattern of the present invention.

Regarding polysilane which can be used in the present invention, in case of the aliphatic or alicyclic hydrocarbon, the number of a carbon atom is 1 to 10, preferably 1 to 6. In case of the aromatic hydrocarbon, a kind of the substituents $R_1$ to $R_4$ and the value of m and n are not particularly important and this polysilane resin may have organic solvent-solubility and can be coated to form an uniform film (film thickness of 0.1 to 10 μm). For example, the substituted or non-substituted aliphatic hydrocarbon group is a group such as a methyl group, an n-propyl group, an n-butyl group, an n-hexyl group, a phenylmethyl group, a trifluoropropyl group or a nonafluorohexyl group. The aromatic hydrocarbon is a group such as a p-tolyl group, a biphenyl group or a phenyl group. The alicyclic hydrocarbon is a group such as a cyclohexyl group or a methyl cyclohexyl group.

The photoradical generator which can be used in the present invention is a compound which generates a halogen radical by light irradiation. The present inventors has noticed that a Si—Si bond is cut efficiently by the halogen radical, and the photoradical generator is added in the photosensitive resin composition of the present invention so as to increase the sensitiveness of polysilane to light.

By formulating an oxidizing agent in the photosensitive resin composition of the present invention, oxygen is easily inserted into the Si—Si bond, and a synergistic effect can be obtained by an interaction between the photoradical generator and the oxidizing agent. Therefore, it is possible to improve the sensitiveness of polysilane to photodegradation. The oxidizing agent which can be used in the present invention is a compound which can be an oxygen supply source.

The photoradical generator may be any compound which generates a halogen radical by light irradiation and is not specifically limited. Examples thereof include 2,4,6-tris (trihalomethyl)-1,3,5-triazine represented by the formula:

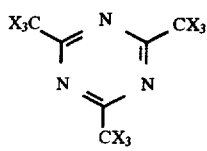

[wherein X is Cl or Br], 2-substituted-4,6-bis(trihalomethyl)-1,3,5-triazine represented by the formula:

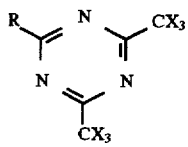

[wherein X is Cl or Br, and R is a substituted or non-substituted aliphatic hydrocarbon group, an alicyclic hydrocarbon group and an aromatic hydrocarbon group], 2,4-substituted-6-trihalomethyl-1,3,5-triazine represented by the formula:

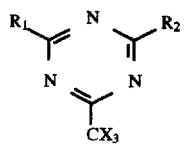

[wherein X is Cl or Br, and $R_1$ and $R_2$ independently indicate a substituted or non-substituted aliphatic hydrocarbon group, an alicyclic hydrocarbon group and an aromatic hydrocarbon group] and the like.

The oxidizing agent may be any compound which can be an oxygen supply source and is not specifically limited. Examples thereof include peroxide (e.g. 3,3',4,4'-tetra-(t-butylperoxycarbonyl) benzophenone), amine oxide (e.g. trimethylamine oxide), phosphine oxide (e.g. triphenylphosphine oxide) and the like.

When the photoradical generator and oxidizing agent are added in an amount of 1 to 30 parts by weight, respectively, based on 100 parts by weight of polysilane, the resulting photosensitive resin composition can be put to practical use. Further, by adding a suitable photosensitive dye in addition to the photoradical generator and oxidizing agent, the halogen radical can also be generated due to photoexcitation of the dye.

The optimum composition of the present invention comprises 1 to 30 parts by weight of the photoradical generator, 1 to 30 parts by weight of the oxidizing agent and 1 to 20 parts by weight of the dye are formulated based on 100 parts by weight of polysilane. As the dye to be used, for example, various soluble dyes, such as coumarin dye, cyanine dye, merocyanine dye etc. are effective.

According to the method for forming a thin film pattern of the present invention, a photosensitive layer of the photosensitive resin composition of the present invention is firstly formed on a suitable substrate. Regarding the substrate, its shape and material is not specifically limited. Glass plate, metal plate, plastic plate, etc. can be used according to the application.

The photosensitive layer is formed on such a substrate. A formation method may be any method capable of forming a photosensitive layer having an uniform thickness, and is not specifically limited. The above polysilane, photoradical generator and oxidizing agent and, if necessary, dye are dissolved in a solvent capable of dissolving the respective components, such as toluene, THF, etc. to give a solution and the solution can be applied using a spin coater. The concentration of the solution is suitably 5 to 15%. It is preferred the dry film thickness of the photosensitive layer is within a range from 0.1 to 10 μm.

One embodiment of the steps of forming a thin film pattern is shown in FIGS. 1 (a) to (d). As shown in FIG. 1 (a), ultraviolet light is irradiated to a laminate 104 for forming pattern thin film comprising a substrate 101 and a photosensitive layer 102, using an ultraviolet light source such as mercury vapor lamp according to the pattern. Ultraviolet light or visible light 110 is normally irradiated through a pattern mask 103 put on the laminate 104 for forming thin film.

The light source used in the present invention has a wavelength wherein the photoradical generator or photosensitive dye is exposed. Preferably, irradiation may be conducted at a light volume of 0.2 to 5 J/cm² per 1 μm in thickness of the photosensitive layer.

The Si—Si bond which exists in the photosensitive layer is cut by light irradiation to form Si—OH (silanol group). Accordingly, a latent image containing a silanol group is formed in the irradiated laminate for forming thin film according to the pattern.

Then, by dipping the laminate for forming thin film in which the latent image containing a silanol group was formed in a metal oxide sol solution, a sol was absorbed at the pattern part of the laminate for forming thin film. In order to increase an absorption rate by swelling the photosensitive layer, water-soluble organic solvents such as acetonitrile, dioxane, tetrahydrofuran, etc. may be added to the metal oxide sol, if necessary, such a water-soluble organic solvent may be formulated in the sol solution in an amount of 1 to 30% by weight. When the amount of the solvent exceeds 30% by weight, partial redissolution of the photosensitive layer is arisen to cause turbulence on the surface of the resulting thin film. In the present invention, absorption of the sol is suitably conducted by dipping a thin film-forming material in the sol solution maintained at 20° to 40° C. for 1 to 40 minutes.

As the material of the metal oxide sol, there can be normally used materials used in a sol-gel process. The kind of the metal varies depending on the objective function, but examples of the material include metal organic substances (e.g. alkoxide, acetylacetonate, acetate, amine, etc.), soluble inorganic salts (e.g. nitrate, etc.) or dispersants of fine oxide particles of metals (e.g. Si, Zr, Pb, Ti, Ba, Sr, Nb, K, Li, Ta, In, Sn, Zn, Y, Cu, Ca, Mn, Fe, Co, La, Al, Mg, V, etc.). These are dissolved in a solvent such as alcohol to prepare a solution, which is isolated by subjecting to the condensation polymerization reaction using a catalyst such as acid or base. Further, all substituents of the metal may not be converted into a condensation-polymerizable functional group, but a part of an organic functional group may be remained. Further, materials which can dissolve or disperse in the sol solution may be added.

When using alkoxide of Si, tetraethoxysilane is hydrolyzed and condensed with dehydrating by dissolving it in a mixed solution of ethanol and water and adding hydrochloric acid to the mixture, followed by stirring at room temperature for 2 hours to give a homogeneous silica sol.

Regarding the composition of the silica sol, it is preferably composed of 50 to 200 parts by weight of ethanol, 1 to 200 parts by weight of water and 0.1 to 3 parts by weight of hydrochloric acid, based on 100 parts by weight of tetraethoxysilane. If necessary, water-soluble organic solvents such as acetonitrile, dioxane, tetrahydrofuran (THF), etc. may be further added.

It is believed that the metal oxide sol is absorbed at the ultraviolet light-irradiated part of the photosensitive layer and incorporated into the interior of the photosensitive layer. It is considered that absorption proceeds into the interior through a fine hole which exists in the ultraviolet light-irradiated part of the photosensitive layer. The diameter of sol particles is several nm to several tens nm and they can be sticked with diffusing. It was confirmed that a particulate material having a suitable size which coexists with sol particles can be diffused together with sol particles into the interior, similar to the case that sol particles exist alone.

Accordingly, when developing a function by absorption of sol particles, there can be given the following cases:

(1) sol particles themselves contain a functional atom or a functional group;

(2) a particulate material, which can be absorbed in the photosensitive layer together with sol particles, coexists;

(3) a compound or a polymer material, which can dissolve in the sol, coexists; and (4) sol particles themselves are absorbed at the ultraviolet light-irradiated part of the photosensitive layer and the non-absorbed part is removed to form an uneven surface shape, thereby developing a function. As a matter of course, two or more sorts of them may be used in combination to develop a function.

Examples of the functional atom include fluorine and the like. Water repellency due to fluorine can be imparted on the photosensitive layer by forming a sol containing a lot of fluorine atoms and absorbing the sol on the photosensitive layer. Examples of the functional group used in such a method include hydrophobic groups (e.g. alkyl group, etc.), ion-exchange groups (e.g. carboxyl group, sulfo group, acidic hydroxyl group, amino group, etc.) and the like.

Examples of the particulate material include copper and silver particles. By preparing a sol in which these particulate materials are coexisted and absorbing the sol and sol particles in the photosensitive layer, copper and silver can be contained in the photosensitive layer as the pattern.

When using a silica sol, the particulate material may be dispersed using the silica sol, or the particulate material may be once dispersed using a nonionic surfactant and then mixed when the silica sol is prepared. In this case, it is necessary to adjust the particle size of the particulate material to not more than 500 nm, preferably not more than 200 nm. When the particle size exceeds 500 nm, particles can not be diffused into the ultraviolet light-irradiated part of photosensitive layer even if they are dipped in the sol solution and, therefore, they can not be sticked. The particle size can be measured by a normal centrifugal sedimentation method. It is considered that silica sol particles are adsorbed on the surface of the particulate material. Adsorption of the silica sol on the surface of particles can be easily confirmed by measuring a zeta potential. For example, the zeta potential of the material which was dispersed using the nonionic surfactant is dispersed becomes stable at −5 to −25 mV because the silanol group came into existence on the surface by absorption of the silica sol.

The material which can dissolve in the sol solution may be any material which dissolves in water or alcohol and which interacts with the silanol group of the silica sol, and it can be diffused into the ultraviolet light-irradiated part of the photosensitive layer together with sol particles and sticked. Suitable examples of the polymer material include polymers containing an alcoholic hydroxyl group (e.g. poly-vinyl alcohol polyethylene glycol, cellulose, etc.), polymers containing an amide group (e.g. poly(2-methyl-2-oxazoline, poly(N-vinylpyrrolidone), poly(N,N-dimethylacrylamide, etc.) and the like. It is possible to impart a function such as flexibility by formulating the above material in the photosensitive layer and gelating at a low temperature at which the material is not decomposed. Further, it is possible to impart a function such as porosity by gelating at the temperature higher than the temperature at which the material is decomposed and utilizing holes obtained after the material was decomposed. In case of obtaining color, it is possible to form a coating pattern by solving dye or dispersing pigments in the sol.

The laminate for forming thin film in which a sol was adsorbed at the pattern part is dried after the sol solution was removed. As a method of removing the sol solution, there can be used a method of washing with water or a method of blowing off by an air blow.

In order to further proceed gelation of sol particles absorbed at the exposed part of the photosensitive layer, drying is conducted at more than 100° C. for 30 minutes to 2 hours. The higher the drying temperature within a permitted range of the substrate and the functional material contained in the sol solution, the more hard membrane having excellent resistance can be obtained. When using a glass substrate and using a silica sol as the sol, an organic substituent is eliminated by heating at not less than 400° C. to give a metal oxide thin film.

Figure 1B:
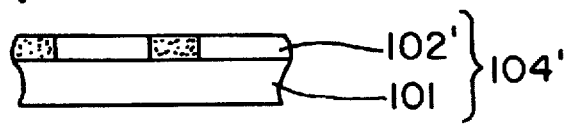

By a thin film pattern-forming step, as shown in FIG. 1(b), a laminate 104' for forming thin film in which a desired pattern is formed.

Figure 1C:
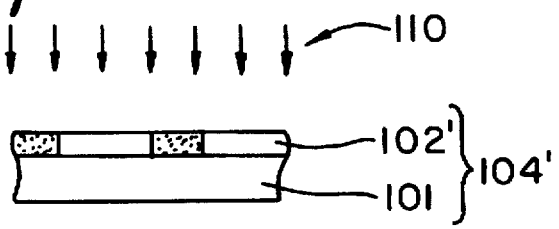
Figure 1D:
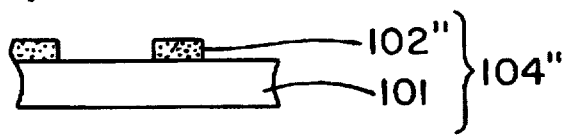

When it is necessary to form unevenness on the glass surface as a pre-groove of an optical disc substrate, an uneven pattern thin film as shown in FIG. 1(d) can be obtained by exposing the total surface to ultraviolet light as shown in FIG. 1(c) and decomposing the residual photosensitive layer to remove. As a method of removing an unnecessary photosensitive layer, there can be used a method of volatilizing by heating and a method of removing with a solvent. When the photosensitive layer is removed by heating, it is sufficient to heat at not less than 200° C. for 10 to 60 minutes. In this case, sol particles may have no functional characteristics.

Further, a thin film having a different function can be easily patterned on the same substrate by changing the part to be exposed to ultraviolet light and repeating the steps of FIGS. 1(a) and (b) using a sol solution of a different formulation.

By such a simple operation, a patterning which was a large problem in the thin film-forming technique by means of the sol-gel processing can be solved. Further, according to the photosensitive resin composition, it becomes possible to complete the exposure for a short period of time.

As described above, a photolithography step using a resist which is necessary for patterning is not required in the method for forming a thin film pattern of the present invention. Further, a pattern thin film formed by this method can be selected according to the required function because it can form a flat layer having no unevenness unless the photosensitive layer of the non-exposed part is removed, or it can form a pattern thin film having uneveness if the photosensitive layer of the non-exposed part is removed.

Further, the patterning can form a fine pattern thin film having resolution of "submicron order" because of high resolution of photocomposition of the photosensitive layer, so that, it is suitable for processing of the uneven surface having high density in comparison with a stamper method.

The applicable area of this technique is wide and a thin film patterning having various functions can be made by selecting the kind of the substrate and material of sol.

According to the present invention, a photosensitive resin composition wherein a sensitiveness of polysilane to photodegradation is improved and a time required for photodegradation is short, and a method for forming a pattern using the same.

The following Preparation Examples, Examples and Comparative Examples further illustrate the present invention in detail but are not to be construed to limit the scope thereof. In the Examples and Comparative Examples, all "%S'" are by weight unless otherwise stated.

[Preparation Example 1]

Preparation of polysilane

To a 1000 ml flask equipped with a stirrer, 400 ml of toluene and 13.3 g of sodium were charged. After sodium was finely dispersed in toluene by vigorous stirring, 61.6 g of phenylmethylchlorosilane was added. Then, the content of the flask was polymerized by heating to 111° C. in a yellow room where ultraviolet light was cut-off, followed by stirring for 5 hours. Thereafter, an excessive amount of sodium was deactivated by adding ethanol to the resulting reaction mixture and the mixture was washed with water to separate an organic layer. The organic layer was poured into ethanol to precipitate polysilane. The resulting crude polymethylphenylsilane was reprecipitated three times from toluene-ethanol to give polymethylphenylsilane having a weight-average molecular weight of 200,000.

[EXAMPLE 1]

100 Parts by weight of polymethylphenylsilane obtained in Preparation Example 1, 10 parts by weight of 2,4-bis(trichloromethyl)-6-(p-methoxyphenylvinyl)-1,3,5-triazine (TAZ-110, manufactured by Midori Kagaku Co., Ltd.) and 15 parts by weight of 3,3'4,4'-tetra-(t-butylperoxycarbonyl) benzophenone (BTTB, manufactured by NOF Corporation) were dissolved in toluene to give a 10% toluene solution. This solution was applied on a quartz substrate using a spin coater to give a thin film having a film thickness of 0.2 µm. Regarding this thin film, a sensitiveness of polysilane to photodegradation was determined.

An ultraviolet absorption spectrum was measured using MCPD-1000 manufactured by Ohtsuka Electronics Co.,Ltd. and an ultraviolet irradiation time at which absorption of $\lambda_{max}$ of polysilane is reduced to half was taken as a sensitiveness. Ultraviolet irradiation was conducted using an ultra-high pressure mercury lamp (CL-50-200A, 500 w) manufactured by Japan Storage Battery Co., Ltd. The results are as shown in Table 1.

[EXAMPLE 2]

According to the same manner as that described in Example 1 except for using 100 parts by weight of the same polysilane as that of Example 1, 10 parts by weight of TAZ-110 and 10 parts by weight of triphenylphosphine oxide (TPPO, manufactured by Tokyo Chemical Industriy Co., LTd.), a sensitiveness was measured. The results are shown in Table 1.

[Comparative Example 1]

According to the same manner as that described in Example 1 except for using only 100 parts by weight of the same polysilane as that of Example 1, a sensitiveness was measured. The results are shown in Table 1.

[Comparative Examples 2 and 3]

According to the same manner as that described in Example 1 except for using 100 parts by weight of the same polysilane as that of Example 1 and 10 or 20 parts by weight of TAZ-110, a sensitiveness was measured. The results are shown in Table 1.

[Comparative Examples 4 to 7]

According to the same manner as that described in Example 1 except for using 100 parts by weight of the same polysilane as that of Example 1 and 15 or 30 parts by weight of BTTB or 10 or 20 parts by weight of TPPO, a sensitiveness was measured. The results are shown in Table 1.

[EXAMPLE 3]

100 Parts by weight of the same polysilane as that of Example 1, 10 parts by weight of 2,4,6-tris(trichloromethyl) 1,3,5-triazine (TCMT, manufactured by Midori Kagaku Co., Ltd.), 15 parts by weight of BTTB and 5 parts by weight of coumarin pigment, 3,3'-carbonylbis(7-diethylaminocoumarin) (manufactured by Eastman Kodak Co.) were dissolved in THF to give a 10% THF solution. According to the same manner as that described in Example 1, a sample was prepared using the solution.

A visible light irradiation time at which absorption of $\lambda_{max}$ of polysilane is reduced to half was taken as a sensitiveness. Visible light irradiation was conducted using an ultra-high pressure mercury lamp (CL-50-200A, 500 w) manufactured by Japan Storage Battery Co., Ltd. and light having a wavelength of less than 440 nm was cut-off with a filter. The results are as shown in Table 2.

[Comparative Examples 8 and 9]

According to the same manner as that described in Example 3 except for using 100 parts by weight of the same polysilane as that of Example 1, 10 parts by weight of TCMT and 15 parts by weight of BTTB or 5 parts by weight of the same coumarin pigment as that of Example 3, a sensitiveness was measured. The results are shown in Table 2.

TABLE 1

| | Additive (amount based on 100 parts by weight of polysilane) | | | |
|---|---|---|---|---|
| Example No. | TAZ-110 | BTTB | TPPO | Exposure time (second) |
| Example 1 | 10 | 15 | 0 | 12 |
| Example 2 | 10 | 0 | 10 | 19 |
| Comparative Example 1 | 0 | 0 | 0 | 62 |
| Comparative Example 2 | 10 | 0 | 0 | 50 |
| Comparative Example 3 | 20 | 0 | 0 | 25 |
| Comparative Example 4 | 0 | 15 | 0 | 43 |
| Comparative Example 5 | 0 | 30 | 0 | 42 |
| Comparative Example 6 | 0 | 0 | 10 | 58 |
| Comparative Example 7 | 0 | 0 | 20 | 56 |

TABLE 2

| | Additive (amount based on 100 parts by weight of polysilane) | | | |
|---|---|---|---|---|
| | TCMT | BTTB | Coumarin | Exposure time (second) |
| Example 3 | 10 | 15 | 5 | 120 |
| Comparative Example 8 | 10 | 15 | 0 | 440 |
| comparative Example 9 | 10 | 0 | 5 | 630 |

[Preparation Example 2]

13 g of tetraethoxysilane, 20 g of ethanol and 13 g of water were charged in a beaker and 0.1 g of concentrated hydrochloric acid was added with stirring, and the mixture was stirred at 30° C. for 2 hours, hydrolyzed and condensed with dehydration to prepare a sol. To which were added 43 g of water and 10 g of acetonitrile to give a silica sol for dipping.

[EXAMPLE 4]

A toluene solution having the same formulation as that of Example 1 was applied on a glass substrate (5 cm×5 cm×0.11 cm in thickness) using a spin coater ("PRS-14", manufactured by Dynapart Co.) so that the dry film thickness may become 2 µm. A quartz photomask was put on the resulting laminate for forming thin film pattern, which was exposed to ultraviolet light at a light volume of 0.5 J/cm$^2$ using an ultra-high pressure mercury lamp parallel exposure equipment (CL-50-200A, manufactured by Japan Storage Battery Co., Ltd.). After the photomask was removed, the laminate in which a latent image was formed was dipped in a sol obtained in Preparation Example 2 for 5 minutes. After dipping, the laminate was washed with water and dried at 200° C. for 30 minutes to give a patterned thin film of a silica gel.

Further, ultraviolet light was irradiated on the total surface of this laminate for forming thin film pattern at a light volume of 0.5 J/cm$^2$ using the above equipment and the laminate was dried at 200° C. for 30 minutes. As a result, a photosensitive layer other than a pattern of the silica gel was volatilized to form an uneven pattern of the thin film of the silica gel on the glass substrate. Further, the uneven pattern was completely changed into a glass of silicon oxide by calcinating at 600° C. for 30 minutes, and the uneven profile was measured using a surface profile measuring equipment (Dektak 3ST, manufactured by ULVAC Co., Ltd.). As a result, it was found that a prepreg having a height of 0.5 µm was formed. Thus, it is possible to conduct a fine uneven processing on the surface of the glass without using a stamper method or etching method.

[Comparative Example 10]

The same operation as that described in Example 4 was conducted using a 10% solution of polysilane in toluene of Preparation Example 1. As a result, a sol was not fixed because a clear latent image was not formed. Therefore, a sufficient uneven pattern could not be obtained.

[Preparation Example 3]

To a solution composed of 25 g of tetraethoxysilane, 25 g of ethanol and 17 g of water, 10 g of a pigment for each color and 100 g of glass beads were added in turn. After dispersing at 20° C. for 2 hours, 0.3 g of hydrochloric acid was added, followed by dispersing at 20° C. for 2 hours to prepare a colored sol. Further, a sol solution having the same formulation in which no coloring material is added was prepared. Then, 30 g of the resulting sol solution and 10 g of the colored sol were mixed and 30 g of water was added to give a sol solution for coloring.

"Microlith Red 2BWA", "Microlith Blue 4GWA" and "Irgalite Green GLN New" (manufactured by Ciba Geigey Co.) were used as a red pigment, a blue pigment and a green pigment, respectively.

[EXAMPLE 5]

A toluene solution having the same formulation as that of Example 1 was applied on a glass substrate (5 cm×5 cm×0.11 cm in thickness) using a spin coater. Then, this wet film was dried to form a photosensitive layer having a thickness of 2 µm.

A silver salt negative film in which a transmission pattern for red color filter was formed was put on the resulting filter material, and a laminate thus obtained was exposed to ultraviolet light at a light volume of 0.5 J/cm$^2$ using an ultra-high pressure mercury lamp. After the silver salt negative film was removed, the filter material in which a latent image was formed was dipped in a sol solution for red coloring of Preparation Example 3.

Then, a silver salt negative film in which a transmission pattern for blue color filter was formed was put on the filter material in place of the silver salt negative film in which a transmission pattern for red color filter was formed, and the resulting laminate was exposed to give a latent image. Then, the second coloring was conducted using a sol for blue coloring.

According to the same manner as that described above except for using a silver salt negative film in which a transmission pattern for green color filter was formed and a sol for green coloring, the third coloring was conducted to give a color filter.

The resulting filter is highly transparent and contains no color mixture. A spectral transmittance of the color filter was measured using MCPD-1000 manufactured by Ohtsuka Electronics Co., Ltd. The results are as follows: R: 3%, G: 6%, B: 4% at maximum absorption wavelength part.

[Comparative Example 11]

The same operation as that described in Example 5 was conducted using a 10% solution of polysilane in toluene of Preparation Example 1. As a result, a clear latent image was not formed by exposure and, therefore, sufficient coloring could not be obtained even if the filter material was dipped in a sol.

What is claimed is:

1. A photosensitive resin composition consisting essentially of:

(a) a polysilane having a structure of the formula:

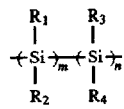

wherein $R_1$, $R_2$, $R_3$ and $R_4$, the same or different, are selected from the group consisting of a substituted or non-substituted aliphatic hydrocarbon group, an alicyclic hydrocarbon group, an aromatic hydrocarbon group, and wherein at least one of m and n are positive integers, (b) a photoradical generator, and (c) an oxidizing agent which functions as an oxygen supply source.

2. The photosensitive resin composition according to claim 1, which further comprises a photosensitive dye.

3. A photosensitive resin composition according to claim 1 wherein the aliphatic or alicyclic hydrocarbons of $R_1$, $R_2$, $R_3$ and $R_4$ each have 1 to 10 carbon atoms.

* * * * *